(12) United States Patent
Liu

(10) Patent No.: US 6,811,662 B1
(45) Date of Patent: Nov. 2, 2004

(54) SPUTTERING APPARATUS AND MANUFACTURING METHOD OF METAL LAYER/METAL COMPOUND LAYER BY USING THEREOF

(75) Inventor: Yu-Cheng Liu, Ilan (TW)

(73) Assignee: Powership Semiconductor Corp., Hsinchu (TW)

(*) Notice: Subject to any disclaimer, the term of this patent is extended or adjusted under 35 U.S.C. 154(b) by 0 days.

(21) Appl. No.: 10/604,857

(22) Filed: Aug. 22, 2003

(51) Int. Cl.[7] .................. C23C 14/34; C23C 14/35; C25B 11/00

(52) U.S. Cl. .................. 204/298.09; 204/298.16; 204/192.12; 204/192.17; 438/625; 438/648; 438/656; 438/685

(58) Field of Search ............ 204/298.02, 298.09, 204/298.16, 298.17, 298.19, 298.21, 192.1, 192.12, 192.15, 192.17; 438/761, 763, 622, 625, 627, 629, 643, 648, 652, 653, 656, 685

(56) References Cited

U.S. PATENT DOCUMENTS

| | | | | |
|---|---|---|---|---|
| 3,856,918 A | * | 12/1974 | Skrivan et al. | 423/69 |
| 4,339,326 A | * | 7/1982 | Hirose et al. | 204/298.38 |
| 4,771,730 A | * | 9/1988 | Tezuka | 118/723 E |
| 5,328,585 A | * | 7/1994 | Stevenson et al. | 204/298.2 |
| 5,478,609 A | * | 12/1995 | Okamura | 427/572 |
| 5,744,016 A | * | 4/1998 | Yamada et al. | 204/298.11 |
| 5,892,207 A | * | 4/1999 | Kawamura et al. | 219/492 |
| 6,015,594 A | * | 1/2000 | Yoshikawa | 427/398.1 |
| 6,063,233 A | * | 5/2000 | Collins et al. | 156/345.37 |
| 6,270,633 B1 | * | 8/2001 | Onaka et al. | 204/192.12 |
| 6,284,110 B1 | * | 9/2001 | Sill | 204/298.09 |
| 6,641,701 B1 | * | 11/2003 | Tepman | 204/192.1 |
| 6,673,716 B1 | * | 1/2004 | D'Couto et al. | 438/656 |
| 6,689,254 B1 | * | 2/2004 | Hurwitt | 204/192.12 |
| 2001/0042594 A1 | * | 11/2001 | Shamouilian et al. | 156/345 |
| 2002/0175070 A1 | * | 11/2002 | Furuta | 204/192.16 |
| 2003/0116427 A1 | * | 6/2003 | Ding et al. | 204/192.17 |
| 2003/0164288 A1 | * | 9/2003 | Onishi | 204/192.12 |

\* cited by examiner

*Primary Examiner*—M. Wilczewski
(74) *Attorney, Agent, or Firm*—Jiang Chyun IP Office

(57) ABSTRACT

A sputtering apparatus is provided. The sputtering apparatus comprises cooling water system having a temperature-controlling device for controlling the temperature of the sidewalls of the reaction chamber. During the deposition process of titanium/titanium nitride, the sidewall temperature of the chamber is controlled at about 50° C.~70° C. for reducing the difference of temperature distribution in the chamber so that the reaction temperature within the reaction chamber can be rendered substantially uniform.

4 Claims, 1 Drawing Sheet

SPUTTERING APPARATUS AND MANUFACTURING METHOD OF METAL LAYER/METAL COMPOUND LAYER BY USING THEREOF

BACKGROUND OF INVENTION

1. Field of the Invention

The present invention relates to a manufacturing process of semiconductor device. More particularly, the present invention relates to a sputtering apparatus and a manufacturing method of metal/metal compound layer by using the sputtering apparatus.

2. Description of Related Art

In a process of semiconductor metallization, due to ever increased high degree of integration, it is often required to form a structure with multilevel interconnects, where each metal layer is insulated from the other layers via insulation layers, and different metal layers are connected with conductive plugs.

Aluminum and tungsten are so far the most important and frequently used metals in metallization processes. In prior art, aluminum is formed via magnetron DC sputtering and, due to its low resistivity, is primarily used as conducting wire between semiconductor devices. Tungsten is formed via chemical vapor deposition (CVD) and, due to its superior property for multi-layer covering and easiness for etching, is primarily used as conductive plug for filling into contact or via openings. However, aluminum causes a phenomenon of spiking, while tungsten is not desirable due to its adhesive property on substrates. Thus, in order to avoid spiking associated with aluminum and enhance adhesion of tungsten with the insulating layer on two sidewalls and with the metal layer under tungsten, a conductive material called barrier layer is often formed between the metal of aluminum or tungsten and other materials.

Titanium nitride is currently one of the most frequently used materials as barrier layers in very large scale integration process (VLSI). Further, for enhancing the capability of Ohmic Contact of a metal on silicon, titanium nitride barrier layer as used in a process to form a contact metal is utilized in combination with titanium in a form of titanium/titanium nitride. In processes to form contact metals, titanium and titanium nitride are formed via physical vapor deposition (PVD).

One of the methods in prior art to form titanium/titanium nitride is magnetron DC sputtering by depositing a titanium layer on a wafer, where the gas being used is argon and titanium is deposited with a thickness of about 200 Å. Afterwards, reactive sputtering is carried out in the same chamber to form a layer of titanium nitride on the titanium layer, where the gases being used are nitrogen and argon, and titanium nitride is deposited with a thickness of about 400 Å. In the above method, titanium layer and titanium nitride layer are formed in the same chamber, and thus titanium nitride particles will be deposited on the wafer to cause problems on quality of products.

To solve such problem of deposition of titanium nitride particles, methods employed in prior art include changing roughness of process kits, changing magnetic distribution of the apparatus, enhancing quality of target, improving conditions of hardware (e.g., gas pipelines) and modifying purge formulas. However, all of the forgoing methods fail to effectively reduce the deposition of titanium nitride particles and have problems such as high costs and low productivity.

SUMMARY OF INVENTION

In view of the foregoing, the present invention provides an apparatus and a manufacturing method of metal layer, for reducing the deposition of titanium nitride particles, avoiding adhesion of titanium nitride particles, and to improve adhesive property of titanium and titanium nitride.

According to one object of the present invention is to provide a sputtering apparatus capable of maintaining the reaction temperature within the chamber substantially uniform. According to another object of the present invention is to provide a water-cooling system that is capable of controlling the inner sidewall of the chamber for rendering the reaction temperature within the chamber substantially uniform.

According to another object of the present invention is to provide a manufacturing method of forming metal/metal compound layer using sputtering apparatus of the present invention so that the adhesion property of the metal/metal compound layer can be effectively promoted.

According to another object of the present invention is to provide a manufacturing method of forming metal/metal compound layer using sputtering apparatus of the present invention so that the number of particle deposition on the wafer can be substantially reduced.

In accordance with the above objects and other advantages of the present invention, a sputtering apparatus, and a manufacturing method of forming a metal/metal compound layer is provided. The sputtering apparatus includes a chamber, a cathode, a power-supplying device, a metal target, a wafer-supporting device, a pressure-reducing device, a gas-supplying device, a temperature-measuring device and a water-cooling system. The cathode is installed on the top of the chamber. The power-supplying device is connected to the cathode. The metal target is installed on the cathode. The wafer-supporting device, on which a wafer can be held, is installed in the chamber and is coaxial with and parallel to the metal target. The pressure-reducing device is connected to the chamber to keep the vacuum in the chamber on a certain level. The gas-supplying device is connected to the chamber to supply gases to the chamber. The temperature-measuring device includes a temperature sensor and a temperature receiver. The temperature sensor is installed on the inner sidewall of the chamber to measure the sidewall temperature of the chamber. The temperature receiver is connected to the temperature sensor to receive and store the temperature data measured by the temperature sensor. The water-cooling system includes cooling water piping and a temperature controlling device of the chamber. The cooling water piping encircles on the sidewalls of the chamber. The temperature controlling device of the chamber is connected to the cooling water piping and the temperature sensor to supply cooling water into the cooling water piping and to adjust flow rate of the cooling water to control temperature of the inner sidewalls of the chamber based on temperature signals received from the temperature receiver.

A magnetron device is installed in the cathode of the foregoing sputtering apparatus. The power-supplying device is a high-voltage DC power supplier, and the temperature sensor is a thermo couple. As installed in the sputtering apparatus to measure the sidewall temperature of the chamber, the temperature-measuring device can be utilized in a sputtering process for feedback control of the water-cooling system to keep inner wall temperature of the chamber at about 50° C.~70° C., for reducing the difference of temperature distribution in the chamber, and thereby improving adhesive property of titanium and titanium nitride, and reducing the deposition of titanium nitride particles.

The present invention further provides a manufacturing method of metal layer/metal compound layer. A wafer is first placed in a chamber. After forming a metal layer on the wafer in the same chamber, a metal compound layer is subsequently formed over the metal layer. During the process of forming the metal layer and the metal compound layer, the sidewall temperature of the chamber is controlled at about 50° C.~70° C.

In the foregoing method, the metal layer is formed with the material of titanium via magnetron DC sputtering, whereas the metal compound layer is formed with the material of titanium nitride via reactive sputtering. The sidewall temperature of the chamber is controlled at about 50° C.~70° C. by measuring the sidewall temperature of the chamber, based on which, the flow rate of cooling water can be adjusted for controlling the sidewall temperature.

According to a principal aspect of manufacturing method of metal layer/metal compound layers of the present invention, during the formation of the metal/metal nitride layers, the sidewall temperature of the chamber is controlled at about 50° C.~70° C. in order to reduce the difference of temperature distribution in the chamber so as to improve adhesive property of the metal layer and the metal compound layer, and reduce the deposition of metal compound particles.

It is to be understood that both the foregoing general description and the following detailed description are exemplary, and are intended to provide further explanation of the invention as claimed.

BRIEF DESCRIPTION OF DRAWINGS

The accompanying drawing is included to provide a further understanding of the invention, and is incorporated in and constitutes a part of this specification. The drawing illustrates an embodiment of the invention and, together with the description, serves to explain the principles of the invention.

DETAILED DESCRIPTION

Figure 1:
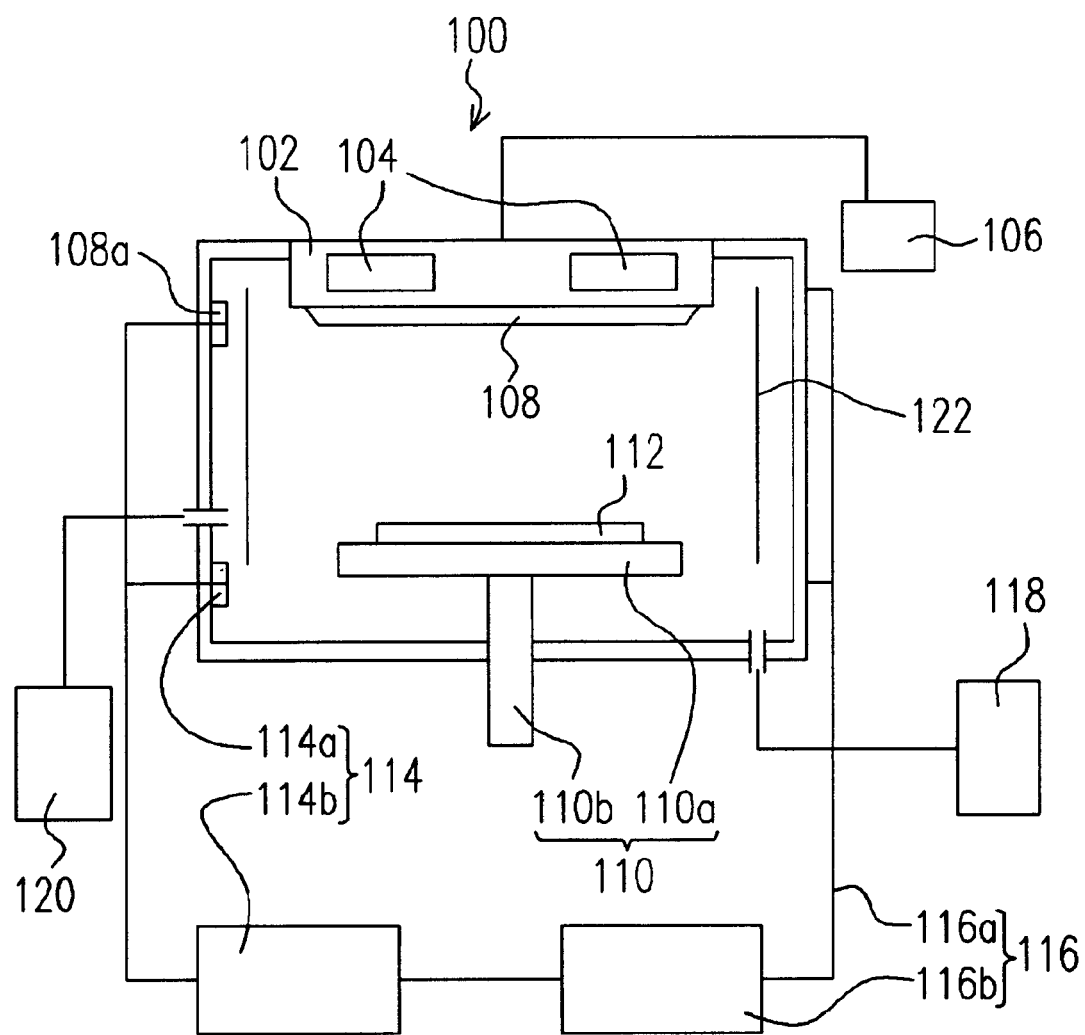
FIG. 1 is a schematic diagram showing the structure of a chamber of a sputtering apparatus according to one of preferred embodiments of the present invention.

FIG. 1 is a schematic diagram showing the structure of a chamber of a sputtering apparatus based on one of preferred embodiments of the present invention. In the embodiment, the sputtering apparatus is, for example, AMAT Endura CL-SIP (Self Ionization Plasma).

In a preferred embodiment of the present invention, a temperature controlling device as installed on the sidewall of the chamber of the sputtering apparatus to control the temperature of the chamber during the process of forming titanium/titanium nitride. The purpose of using the temperature controlling device is for reducing the difference of temperature distribution in the chamber so that the temperature distribution within the chamber can be substantially uniform. According to the present invention, when the titanium/titanium nitride layers are formed under a substantially uniform temperature condition, the adhesive property of titanium and titanium nitride can be substantially promoted and also the deposition of titanium nitride particles can be substantially reduced.

Referring to FIG. 1, a chamber 100 of a sputtering apparatus is provided. The chamber 100 comprises a cathode 102, a magnetron device 104, a power-supplying device 106, a wafer-supporting device 110, a temperature-measuring device 114, a water-cooling system 116, an air-extracting device 118, and an air-supplying device 120, etc.

The cathode 102 is, for example, installed on the top portion of the chamber 100. The magnetron device 104 is installed in the cathode 102. The power-supplying device 106, as connected to the cathode 102, is a high-voltage DC power-supplying device, for example. The metal target 108 is installed on the cathode 102.

The wafer-supporting device 110 is installed in the chamber 100, and is coaxial with and parallel to the metal target 108. The wafer-supporting device 110 includes a wafer-supporting platform 110a and a supporting axle 110b, where the wafer 112 is placed on the wafer-supporting platform 110a. The supporting axle 110b can be used, via an elevating device (not shown), to adjust the height of the wafer-supporting platform 110a.

The temperature-measuring device 114 includes a temperature sensor 114a and a temperature receiver 114b. The temperature sensor 114a is installed, for example, on the inner sidewall of the chamber 100 to measure the temperature of the inner sidewall of the chamber 100. In the present embodiment, the temperature sensor 114a is a thermo couple, for example. Alternatively, two temperature sensors may be used for measuring the temperature of the inner sidewall, wherein, for example, one of the two temperature sensors can be installed on an upper portion of the inner sidewall of the chamber 100 and the other temperature sensor can be installed on a lower portion thereof. The temperature receiver 114b receives and stores the temperature data measured by the temperature sensor 114a.

The water-cooling system 116 includes a cooling water piping 116a and a flow-controlling device 116b (the temperature-controlling device of the chamber sidewall), for controlling the inner sidewall temperature of the chamber 100. The cooling water piping 116a encircles on the sidewalls of the chamber 100 and is connected to the flow-controlling device 116b. The flow-controlling device 116b is further connected to the temperature receiver 114b. Based on the temperature signals from the temperature sensor 114b, the flow rate of the cooling water is adjusted to control the temperature of the inner sidewalls of the chamber 100.

The pressure-reducing device 118 is, for example, an air-extracting outlet connected to the chamber 100 for keeping a certain degree of vacuum within the chamber 100, wherein the vacuum can be created by extracting gases from the chamber 100. The gas-supplying device 120 is, for example, a gas inlet connected to the chamber 100 for supplying reaction gases to the chamber 100. Moreover, a process kit 122, for example, is installed in the chamber 100 to prevent metal from adhering to the sidewalls of the chamber during sputtering processes.

In the sputtering apparatus of the present invention, the temperature-measuring device 114 is installed to measure the sidewall temperature of the chamber 110 such that the temperature-measuring device 114 can be utilized in a sputtering process for feedback control of the water-cooling system 116 for maintaining the inner sidewall temperature of the chamber at about 50° C.~70° C., and thereby reducing difference of temperature distribution within the chamber so that the temperature within the chamber can be rendered substantially uniform. According to the present invention, when the titanium/titanium nitride layers are formed under a substantially uniform temperature condition, the adhesive property of metal and metal compound can be substantially promoted, and also the deposition of metal compound particles can be substantially reduced.

The following is a description on a manufacturing method of metal/metal compound by using the sputtering apparatus of the present invention. Manufacturing of titanium/titanium nitride is taken as an example for describing manufacturing method of the present invention.

Further referring to FIG. 1, first, the target metal 108 (e.g., a titanium metal) is placed on the cathode 102 and the wafer 112 is placed on the wafer-supporting platform 110a. Heat is then applied via radiation, as a pretreatment step, to reach a temperature of about 350° C., for removing pollutants on the surface of the wafer.

Next, argon is supplied to the chamber 100 by using the gas-supplying device 120. Temperature in the chamber 100 is then adjusted to, for example, about 250° C., and pressure in the chamber is adjusted to a range of, for example, about tens of m-torr. The power-supplying device 106 is turned on to carry out sputtering (magnetron DC sputtering) of metal layer (titanium). At the same time when the sputtering process of metal layer (titanium) is performed, the inner sidewall temperature of the chamber 100 is controlled at about 50° C.~70° C. Method to control the inner sidewall temperature of the chamber 100 involves, for example, measuring the inner sidewall temperature of the chamber 100 by the temperature sensor 114a, sending the temperature signals to the temperature receiver 114b, and transferring such signals via the temperature receiver 114 to the flow-controlling device 116b so as to control the flow rate of cooling water and consequently to maintain the inner sidewall temperature of the chamber 100 at a range, for example, about 50° C.~70° C. When the thickness of titanium reaches a predetermined value, for example 200 Å, the process of titanium sputtering is then stopped.

Subsequently, sputtering of metal compound (titanium nitride) is carried out in the same chamber. First, reaction gases, for example argon and nitrogen, are supplied to the chamber 110 through a gas-supplying device 120. The temperature in the chamber 100 is then adjusted to, for example, about 253° C., and the pressure in the chamber is also adjusted to a range of, for example, about tens of m-torr. The power-supplying device 106 is turned on to carry out sputtering (reactive sputtering) of metal compound (titanium nitride). In the process of the sputtering of metal compound (titanium nitride), metal atoms (titanium atoms), as sputtered via ion bombardment, will react with nitrogen atom, as generated in plasma via dissociation reactions, to form metal compound (titanium nitride) depositing on the surface of the wafer. Similarly, in the process of the sputtering of metal compound (titanium nitride), feedback control of the water-cooling system 116 is achieved through the temperature-measuring device 114 for maintaining the inner sidewall temperature of the chamber 100 at about 50° C.~70° C. When the thickness of metal compound (titanium nitride) reaches a predetermined value, for example 400 Å, the process of metal compound (titanium nitride) sputtering is then stopped. Then, the process of titanium/titanium nitride sputtering is completed on a wafer, and the wafer is removed from the chamber. Another wafer is subsequently loaded for another titanium/titanium nitride sputtering process.

According to the embodiment of the present invention, during the titanium/titanium nitride sputtering processes, the sidewall temperature of the chamber is controlled to be maintained at about 50° C. and the number of particles on the wafer is measured, wherein the number of particles on the wafer with diameters greater than 0.2 μm is 20, and the number of particles with diameters greater than 1.0 μm is 3. On the other hand, in a condition when the sidewall temperature of the chamber is not controlled, and the number of particles on the wafer with diameters greater than 0.2 μm were 86, and the number of particles with diameters greater than 1.0 μm were 23. Accordingly, it is evident that the sputtering process and apparatus of the present invention can effectively reduce particle deposition.

The present invention provides a temperature-controlling device that is installed on a sidewall of the chamber of the sputtering apparatus, and during the process of titanium/titanium nitride sputtering, the sidewall temperature of the chamber is controlled at about 50° C.~70° C., so that the difference of temperature distribution in the chamber is reduced, in other words, the temperature condition within the chamber can be rendered substantially uniform. According to the present invention, when titanium/titanium nitride layers are formed under a uniform temperature condition, the adhesive property of titanium and titanium nitride can be substantially improved, and also, the deposition of titanium nitride particles can be substantially reduced.

In the foregoing embodiment of the present invention, while the temperature sensor has been described exemplarily with thermo couple, the temperature sensor can be other kinds of devices with a temperature measuring function. Additionally, while two of temperature sensors have been disclosed exemplarily in the embodiment, an appropriate number of the temperature sensors can be used in actual situations.

In the foregoing embodiment, furthermore, while the process and apparatus are described exemplarily with the formation of titanium/titanium nitride, the process and apparatus can be employed to form other metal layers and metal compound layers as desired.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A sputtering apparatus, comprising:

a chamber;

a cathode installed on the top of the chamber;

a power-supplying device connected to the cathode;

a metal target installed on the cathode;

a wafer-supporting device installed in the chamber, being coaxial with and parallel to the metal target, and a wafer is held on the wafer-supporting device;

a pressure-reducing device, connected to the chamber, for supplying reaction gases to the chamber;

a temperature-controlling device, comprising:

a temperature sensor installed on an inner sidewall of the chamber for measuring a temperature of the inner sidewall of the chamber;

a temperature receiver, connected to the temperature sensor, for receiving and storing temperature data measured by the temperature sensor;

a water-cooling system, comprising:

a cooling water piping, encircling sidewalls of the chamber; and a temperature-controlling device connected to the cooling water piping and the temperature sensor, for supplying cooling water to the cooling water piping, and based on temperature signals from the temperature receiver, for controlling flow rate of the cooling water and consequently controlling the temperature of the inner sidewall of the chamber.

2. The sputtering apparatus of claim 1, wherein a magnetron device is installed in the cathode.

3. The sputtering apparatus of claim 1, wherein the power-supplying device comprises a high-voltage DC power-supplier.

4. The sputtering apparatus of claim 1, wherein the temperature sensor comprises a thermal couple.

* * * * *